United States Patent [19]

Andrade et al.

[11] Patent Number: 5,694,333

[45] Date of Patent: Dec. 2, 1997

[54] SYSTEM AND METHOD FOR PERFORMING MORE EFFICIENT WINDOW CONTEXT SWITCHING IN AN INSTRUMENTATION SYSTEM

[75] Inventors: Hugo Andrade, Williamson County; Brian Keith Odom, Travis County, both of Tex.

[73] Assignee: National Instruments Corporation, Austin, Tex.

[21] Appl. No.: 425,765

[22] Filed: Apr. 19, 1995

[51] Int. Cl.$^6$ .................................................. G06K 15/00
[52] U.S. Cl. .............................. 364/514 C; 395/842
[58] Field of Search .................. 364/514 C; 395/375, 395/200.08, 448, 468, 471, 800, 440, 842, 843, 851, 846, 848, 311, 403, 427, 433; 370/62, 259, 260, 261, 262; 379/201, 202

[56] References Cited

U.S. PATENT DOCUMENTS

| | | | |
|---|---|---|---|
| 5,428,779 | 6/1995 | Allegrucci et al. | 395/678 |
| 5,479,441 | 12/1995 | Tymes et al. | 375/200 |
| 5,495,522 | 2/1996 | Allen et al. | 379/201 |

OTHER PUBLICATIONS

MC689440, Dual–Channel Direct Memory Access Controller, Motorola Semiconductor Products Inc., Austin, Texas, Feb., 1984, pp. 1–10 through 8–4, Foldout 1–8.

*Primary Examiner*—Dang Ton
*Attorney, Agent, or Firm*—Conley, Rose & Tayon; Jeffrey C. Hood

[57] ABSTRACT

A system and method for performing more efficient hardware context switches in a computer-controlled instrumentation system including a computer system which controls a plurality of instruments. The instrumentation system includes a direct memory access transfer device which performs various data transfers between the computer system and the various instruments. The system also includes a plurality of processes executing in the computer system which operates through a common window to map cycles onto the instrumentation bus to the various instruments. Each process or thread executing on the CPU requires a specific context, and the DMA transfer device automatically configures itself to different contexts in parallel with operating system context changes. Each process includes corresponding context information stored in memory. When the operating system is invoked to switch in a new process on the CPU, the operating system writes the address of the context information to the DMA transfer device. The DMA transfer device reads the context from memory and automatically configures itself in parallel with context changes performed by the operating system.

18 Claims, 5 Drawing Sheets

SYSTEM AND METHOD FOR PERFORMING MORE EFFICIENT WINDOW CONTEXT SWITCHING IN AN INSTRUMENTATION SYSTEM

FIELD OF THE INVENTION

The present invention relates to an instrumentation system which performs more efficient window context switching, and more particularly to a direct memory access transfer device in an instrumentation system which performs window context switching functions in parallel with operating system context changes to reduce the time required for context switching operations.

DESCRIPTION OF THE RELATED ART

Modern computer-controlled instrumentation systems typically include a computer system which controls a plurality of instruments to perform a desired test and measurement application. Accordingly, the computer system is required to control the operation of a number of different instruments. In computer systems which include modern multi-threaded, multitasking operating systems, a number of different processes or threads may be executing on the computer system CPU to control the operation of the plurality of instruments. In addition, an instrumentation system typically includes a direct memory access (DMA) transfer device which performs data transfers in the system to offload this function from the main CPU.

In order to control a plurality of instruments, processes executing on the computer system typically use a windowing scheme where a window is a mechanism to map address space from the computer system to address space in the respective instruments on the target bus. Processes executing on the computer system generally operate through respective windows to control the plurality of instruments. Ideally, each process operates through a respective window to perform operations on the target bus. However, more commonly, multiple processes or threads executing on the CPU share a single window, i.e., multiple processes operate through the same window, to perform operations on the various instruments.

When multiple processes are required to operate through a single window to perform operations on the various instruments, each of the processes is typically required to have a context separate from the contexts of other processes operating within that window. The window context includes information such as the respective address space that the process maps into the instrumentation bus, such as the VXI bus or MXI bus, the status of the last transfer, the address space of the respective transfer, and whether features such as write posting or read prefetching are used for this process, among others.

When a new process begins executing on the CPU which requires a new window context, the context of the current process is required to be saved, and various elements in the system, including the transfer device, must be programmed with a new context corresponding to the new process. In a system where multiple processes share a single window and are continually being switched into the main CPU for execution, the system must be able to quickly and efficiently switch between different window contexts to perform the desired operations. Therefore, a system and method for improved window context switching in an instrumentation system is desired.

SUMMARY OF THE INVENTION

The present invention comprises a system and method for performing more efficient window context switches. The preferred embodiment of the invention comprises a computer-controlled instrumentation system including a computer system which controls a plurality of instruments. The computer system includes a CPU which executes a plurality of processes or threads, and memory coupled to the CPU. The computer system couples through one or more buses to a plurality of instruments. The instrumentation system includes a direct memory access (DMA) transfer device which performs various data transfers between the computer system and the various instruments.

Processes executing on the CPU interface to the plurality of instruments through one or more windows, wherein a window represents mapping of address space in the computer system to address space in the respective instrument being accessed. When multiple processes share a common window, each of the processes generally has a unique context, and the DMA transfer device must be configured according to this context when the process is switched into the CPU. The window context includes the address space in the instrumentation bus, e.g., the VXI bus or MXI bus, that the process maps to, the status of the last transfer, the address space of the transfer, and whether to use features such as write posting, prefetching, etc. A portion of the window context includes programming registers in the DMA transfer device to reflect the proper address space and address mapping. The context change also requires the operating system to perform other context change operations, such as saving values corresponding to the prior process in various stacks and loading new values corresponding to the new process.

In the preferred embodiment of the invention, the DMA transfer device configures itself to different window contexts in parallel with the context changes performed by the operating system. This reduces the amount of time necessary for window context changes and thus increases system efficiency. For each process or thread executing through a window which requires a different window context, the context information is stored in memory. When a new process begins execution on the CPU, a context switch handler within the operating system saves the current context, notifies the DMA transfer device that a new context is necessary, and provides the address of the context information to the DMA transfer device. The operating system then performs various context switching operations. During this time, the DMA transfer device reads the new context from memory and automatically configures itself using the context dam. The DMA transfer device may also automatically configure other logic in the system, as desired. Thus the operating system executing on the CPU is not required to change the DMA transfer device context. Rather the operating system and the DMA transfer device perform context switching operations in parallel. Thus window context changes require less time, thus improving system performance.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
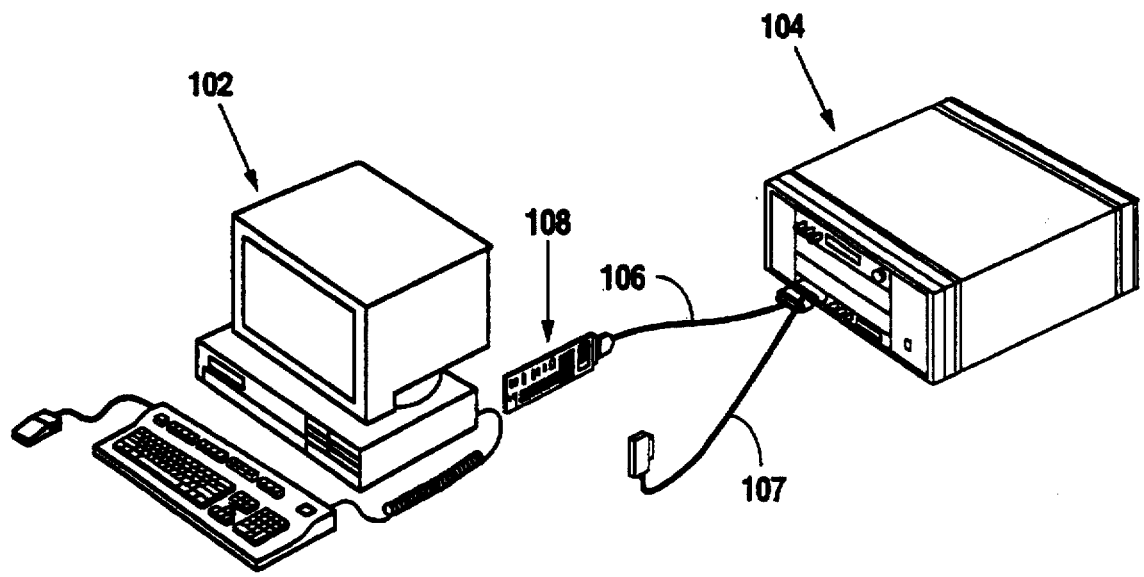
FIG. 1 illustrates an instrumentation system controlled by an external computer.
Figure 2:
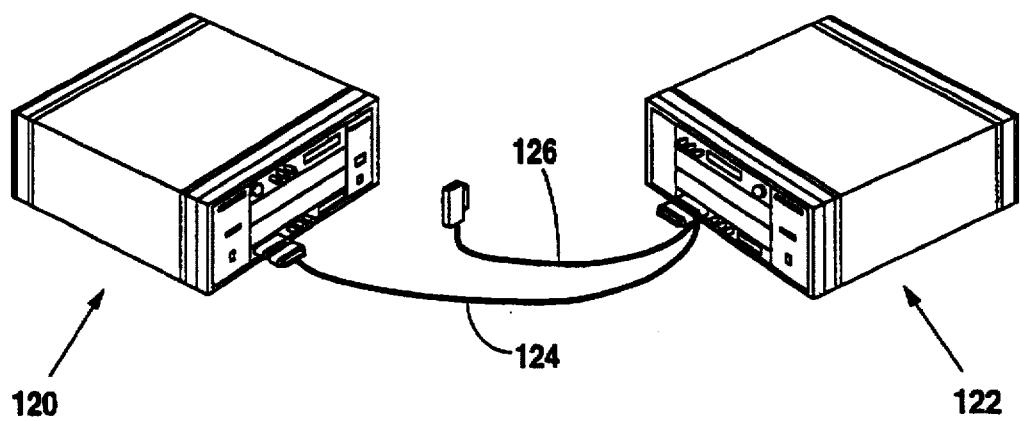
FIG. 2 illustrates an instrumentation system comprising two VXI maintimes controlled by an embedded CPU.

Referring now to FIGS. 1 and 2, instrumentation systems incorporating the system and method of the present invention are shown. As previously discussed, the present invention is preferably incorporated into an instrumentation system. However, it is noted that the present invention may be incorporated into other systems as desired. Also, the systems in FIGS. 1 and 2 are illustrative only, and it is noted that the present invention can be incorporated into various types of instrumentation systems.

The instrumentation system shown in FIG. 1 includes an external computer 102 preferably comprising a system unit, monitor, keyboard, and mouse, as shown. In the embodiment shown in FIG. 1, the external computer 102 includes an expansion bus, preferably based on the industry standard architecture (ISA), also referred to as the AT bus. It is noted that other expansion buses may be used as desired. The external computer 102 includes an interface card referred to as the AT-MXI interface card 108 (shown outside of the external computer for illustrative purposes) which interfaces between the expansion bus in the external computer 102 and a MXI bus implemented on MXI cable 106. The AT-MXI interface card 108 translates between AT bus signals in the external computer 102 and MXI bus signals in the MXI cable 106. The external computer 102 is coupled to a VXI mainframe 104 through the MXI cable 106.

The VXI mainframe 104 includes a first VXI-MXI extender card (230 FIG. 3) which receives MXI signals from the MXI cable 106 and translates these signals into VXI signals which are supplied to the VXI backplane or bus built into the VXI mainframe 104. A plurality of VXI instruments are preferably comprised within the VXI mainframe 104 connected to the VXI backplane. Therefore, the external computer 102 controls VXI instruments in the VXI mainframe 104 by generating signals across the expansion bus through the AT-MXI interface 108, the MXI cable 106, and to the VXI-MXI extender inside the VXI mainframe 104. The VXI-MXI extender converts the respective signals into VXI signals, which are then used to control the VXI instruments. The VXI mainframe 104 may also include a second VXI-MXI extender (230A FIG. 3) which connects to a second MXI cable 107 that is used for connecting to other VXI mainframes as shown. In this manner, a plurality of VXI mainframes 104 can be daisy-chained together to allow the external computer 102 to control a greater number of VXI instruments.

Referring now to FIG. 2, an alternate embodiment which implements the system and method of the present invention is shown. In the system shown in FIG. 2, an external computer is not used to control the instrumentation system, but rather a first VXI mainframe 120 includes an embedded CPU resource manager which controls VXI instruments in the first VXI mainframe 120 and also controls VXI instruments in a second VXI mainframe 122. The first VXI mainframe 120 includes a VXI-MXI extender (not shown) which translates VXI signals into MXI signals that are transferred over MXI cable 124 to the second VXI mainframe 122. The second VXI mainframe 122 includes a VXI-MXI extender (not shown) which translates the MXI signals into VXI signals that are provided over the VXI backplane to control the respective VXI instruments in the second VXI mainframe 122. In this manner, the embedded CPU resource manager inside the first VXI mainframe 120 controls VXI instruments in both the first and second VXI mainframes 120 and 122. Also, the second VXI mainframe 122 may include a second VXI-MXI extender (not shown) which connects to an additional MXI cable 126 that can connect to a third VXI mainframe (not shown) as desired. In this manner, any number of VXI mainframes can be daisy-chained together to allow the embedded CPU resource manager in the first VXI mainframe 120 to control any number of VXI instruments.

Figure 3:
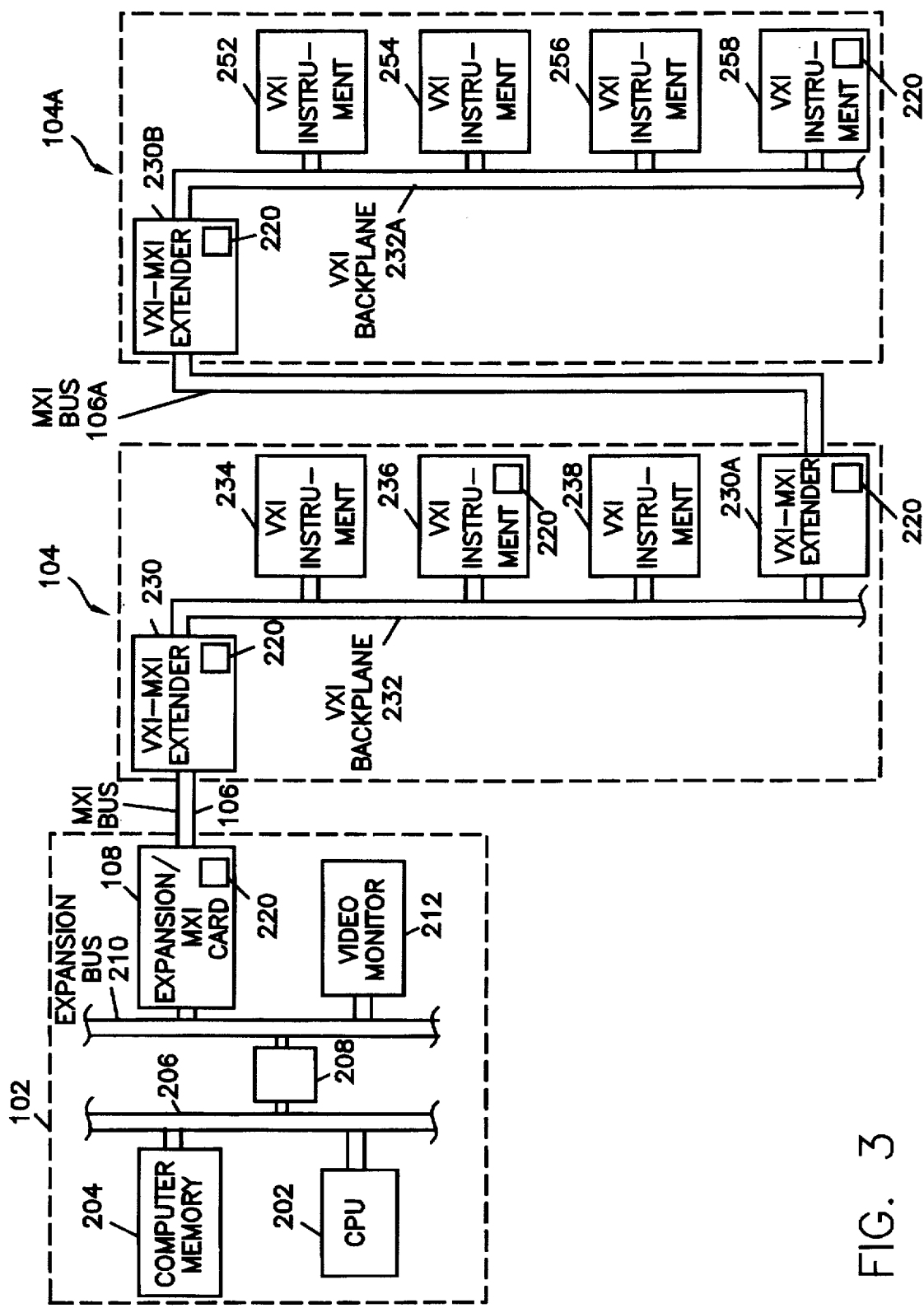
FIG. 3 is a block diagram of the instrumentation system of FIG. 1.

Referring now to FIG. 3, a block diagram illustrating the components comprising the instrumentation system in FIG. 1 is shown. As shown, the external computer 102 includes a CPU 202 and computer memory 204 connected to a system bus 206. The system bus 206 is connected through a bus interface 208 to an expansion bus 210. The expansion bus 210 can be based on any of the various types of bus standards, including the industry standard architecture (ISA), referred to as the AT bus, the extended industry standard architecture (EISA), microchannel architecture (MCA), and the NuBus, as well as others. In addition, the expansion bus can be a local bus such as the Peripheral Component Interconnect (PCI) bus or the VL bus. A video monitor 212 is coupled to the expansion bus 210. The expansion/MXI card 108 is preferably coupled to the expansion bus 210. As discussed above with regard to FIG. 1, the expansion bus used in the embodiment in FIG. 1 is the AT bus, and the expansion/MXI card is the AT-MXI interface card 108. As shown, the expansion/MXI interface card 108 includes DMA transfer logic 221 and context switching logic 220 according to the present invention. The context switching logic 220 performs window context switching operations in parallel with the operating system executing on the CPU 202 to increase system performance.

The expansion/MXI card 108 couples through the MXI bus over a MXI cable 106 to a VXI-MXI extender 230. The VXI-MXI extender 230 is coupled to a VXI backplane 232. A plurality of VXI instruments 234, 236, and 238 are preferably coupled to the VXI backplane as shown. The VXI-MXI extender 230 translates MXI signals received from the MXI bus 106 into VXI signals that are provided over the VXI backplane 232 and vice-versa. The VXI-MXI extender 230 preferably includes DMA transfer logic 221 as well as context switching logic 220 according to the present invention, which is similar to the context switching logic 220 in the expansion/MXI card 108. One or more of these VXI instruments, such as the VXI instrument 236, may also include DMA transfer logic 221 and context switching logic 220 according to the present invention. In one embodiment of the invention, the VXI mainframe 104 includes a second VXI-MXI extender 230A which couples through a second MXI cable 106A to a second VXI mainframe 104A. The second VXI mainframe 104A includes a third VXI-MXI extender 230B which connects to the MXI bus 106A. The VXI-MXI extender 230B connects to a VXI backplane 232A. A plurality of VXI instruments 252, 254, 256, and 258 are connected to the VXI backplane 232A.

The third VXI-MXI extender 230B preferably includes DMA transfer logic 221 and context switching logic 220 according to the present invention. One or more of the VXI instruments 252-258, such as the instrument 258 may also include DMA transfer logic 221 and context switching logic 220 according to the present invention. It is noted that further VXI mainframes can be daisy-chained in this fashion, as desired. In the present disclosure, a device which includes the DMA transfer logic 221 and the context switching logic 220 is referred to as a DMA transfer device.

As discussed further below, when multiple processes share a single window, and a new process is switched into the CPU 202 for execution, the new process typically will require a new context, and various hardware elements within the instrumentation system must be configured according to this new context for the new process to operate properly. When a new process is switched in, a handler referred to as the context switch handler saves the old context and then notifies the DMA transfer device of the context change. The context switch handler also provides the address of the context data to the DMA transfer device. The operating system then begins performing necessary operating system context switching functions. During this time, the DMA transfer device uses the address of the context data stored in memory to retrieve the context data and perform its context change in parallel with the operating system context changes performed by the operating system. This reduces the amount of time required for window context switches to occur, thereby increasing system performance.

Figure 4:
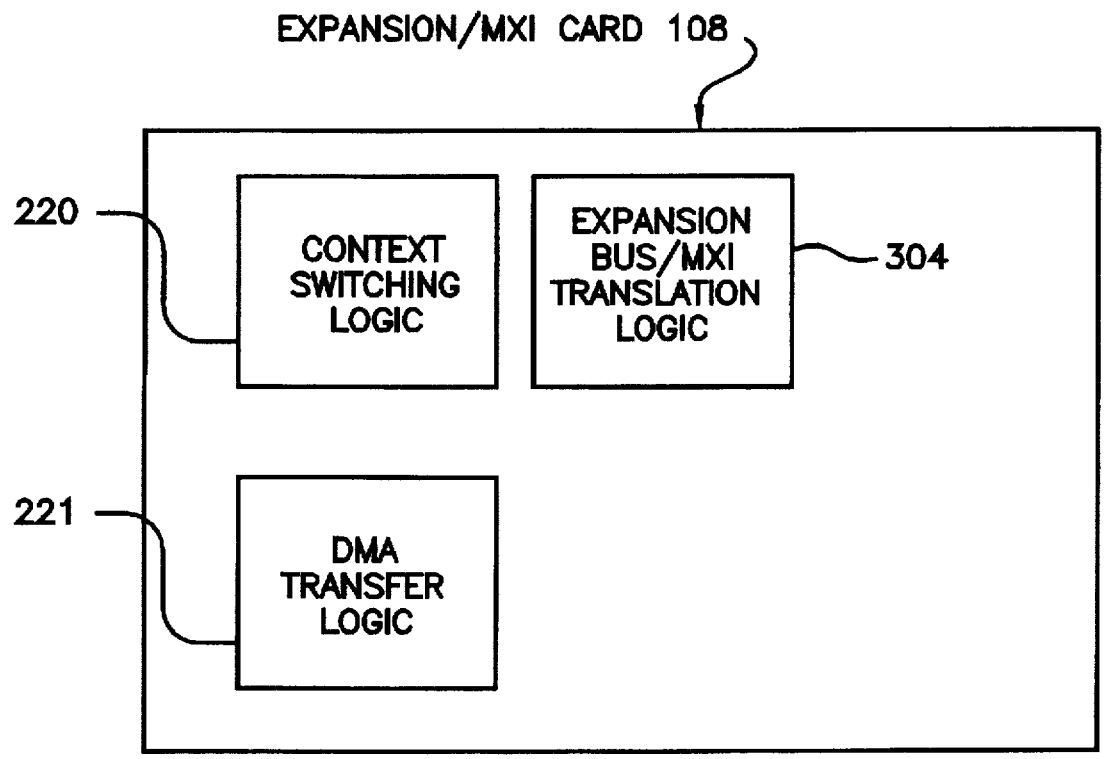
FIG. 4 is a block diagram of the expansion/MXI card in the block diagram of FIG. 3.
Figure 5:
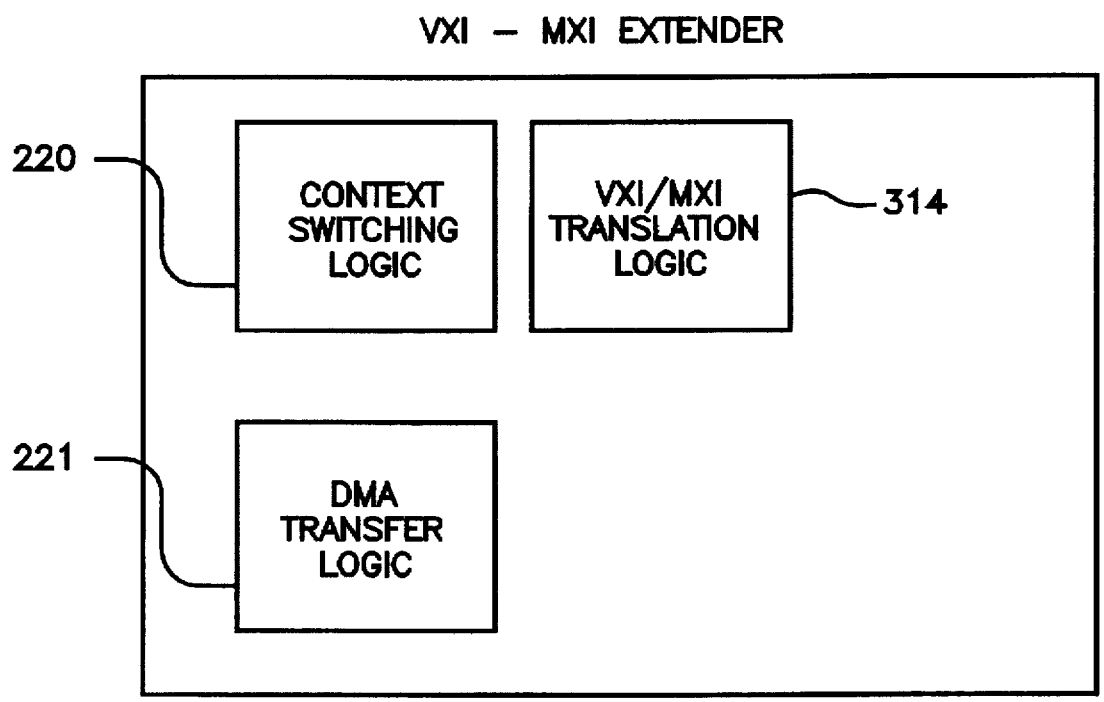
FIG. 5 is a block diagram of the VXI-MXI extender in the block diagram of FIG. 3.

Referring now to FIG. 4, a block diagram illustrating elements comprised in the expansion/MXI card 108 is shown. As shown, the expansion/MXI card 108 includes the context switching logic 220, DMA transfer logic 221 and expansion/MXI translation logic 304. As discussed above, the context switching logic 220 performs context switching operations according to the present invention. The DMA transfer logic 221 performs data transfers and the expansion/MXI translation logic 304 converts signals between the expansion bus 210 and the MXI bus 106. Referring now to FIG. 5, a block diagram illustrating the components in each of the VXI-MXI extenders 230, 230A, and 230B are shown. In the preferred embodiment, the VXI-MXI extenders 230, 230A, and 230B are identical. As shown, each VXI-MXI extender includes context switching logic 220, DMA transfer logic 221, and VXI-MXI translation logic 314. As discussed above, the context switching logic 220 performs context switching operations according to the present invention, the DMA transfer logic 221 performs data transfers, and the VXI/MXI translation logic 314 performs translations between VXI and MXI signals.

Referring again to FIGS. 1 and 3, in the preferred embodiment, DMA transfer logic 221 and context switching logic 220 according to the present invention are included on the AT-MXI interface card 108, one or more of the VXI-MXI extenders 230, 230A, and 230B in the VXI maintimes 104 and 104A, and one or more of the VXI instruments such as instruments 236 and 258. The context switching logic 220 enables the respective interface card 108 or extender 230, 230A, or 230B to perform window context changes in parallel with other window context changes.

According to the prior art, when multiple processes shared a single window and a new process was switched in for execution on the CPU 202, the operating system was required to perform all of the various window context switches, including operating system specific context switches as well as programming various registers in the DMA transfer device according to the new context. Since the operating system was performing all 6f the required context switches, the operating system was required to perform each context change operation serially until the entire window context was changed to the new context. Where multiple processes are executing on a single CPU through a single window, the window context switching operations require considerable CPU resources.

Figure 6:
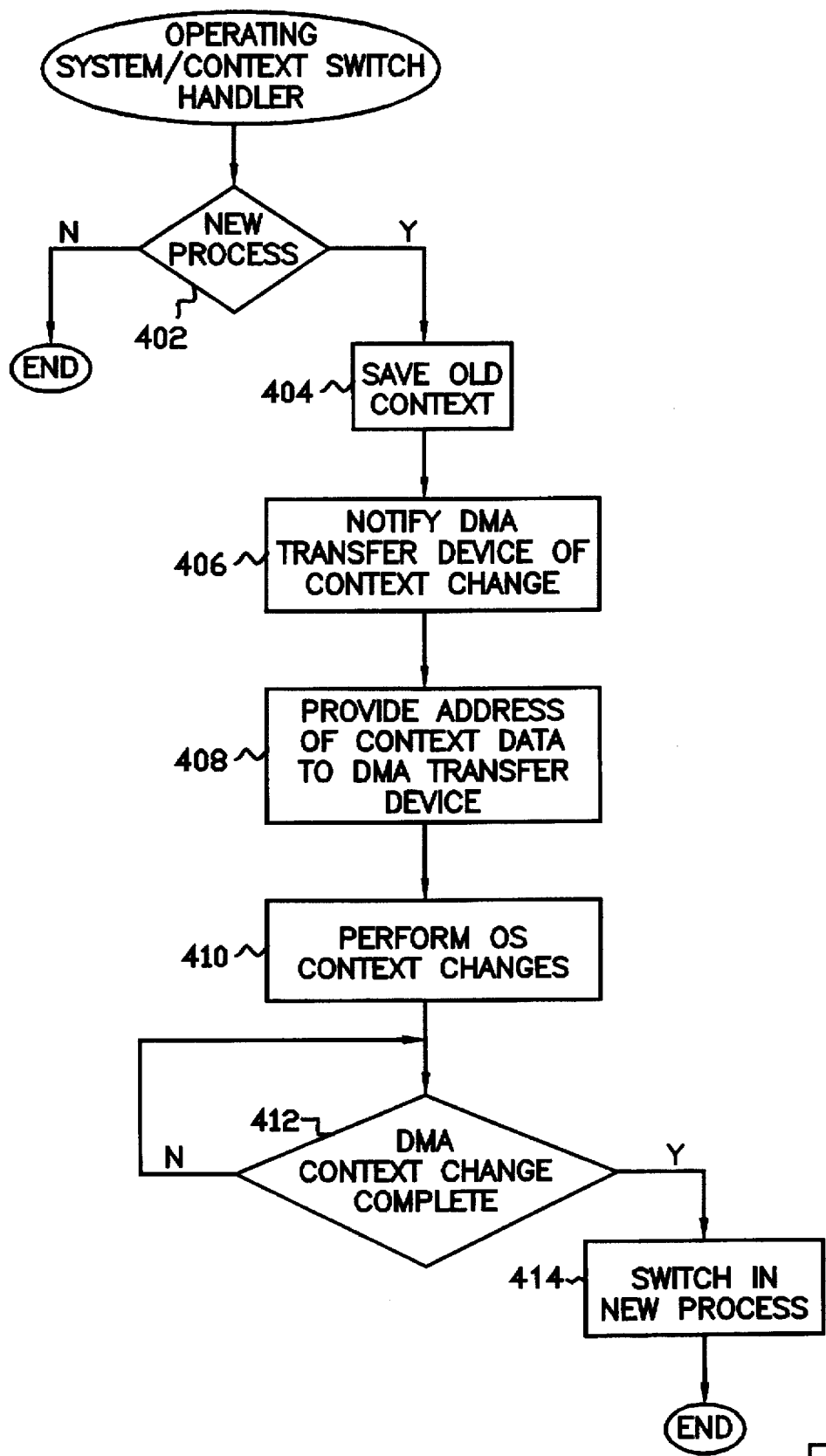
FIG. 6 is a flowchart diagram illustrating operation of the context switch handler notifying the DMA transfer device of a window context change and also illustrating the operating system performing context changes.

Referring now to FIG. 6, a flowchart diagram illustrating operations performed by the context switch handler and the operating system executing on the CPU 202 in the instrumentation system of FIG. 3 is shown. In step 402 a new process is switched in for execution on the CPU 202. This causes the context switch handler to be invoked. In the preferred embodiment, the operating system invokes the context switch handler. In one embodiment, a device driver for the card 108 invokes the context switch handler. It is also noted that the operating system can perform the functions of the context switch handler, as desired.

In step 404 the context switch handler saves the current context, i.e., the context of the current process executing on the CPU 202, and stores this context in memory, preferably the memory 204. In step 406 the context switch handler notifies the respective DMA transfer device of the context change. In the preferred embodiment, the context switch handler notifies the expansion/MXI card 108, since the expansion/MXI card 108 is the primary DMA transfer device for performing transfers between the computer system and the various instruments. However, it is noted that the context switch handler can notify one or more different DMA transfer devices, such as one or more of the VXI-MXI extenders, or one or more of the plurality of VXI instruments. As noted above, the DMA transfer device is defined as a device which includes the DMA transfer logic 221 and the context switching logic 220.

In step 408 the context switch handler provides the address of the context data for the new process to the DMA transfer device. The context switch handler then returns control back to the operating system. In step 410 the operating system performs various operating system context changes for the new process. This involves the operating system executing on the CPU 202 saving data on various stacks and loading new values in various registers within the system according to the new window context for the new process. The context changes performed by an operating system when a new process begins execution on the CPU are generally well known in the art.

Figure 7:
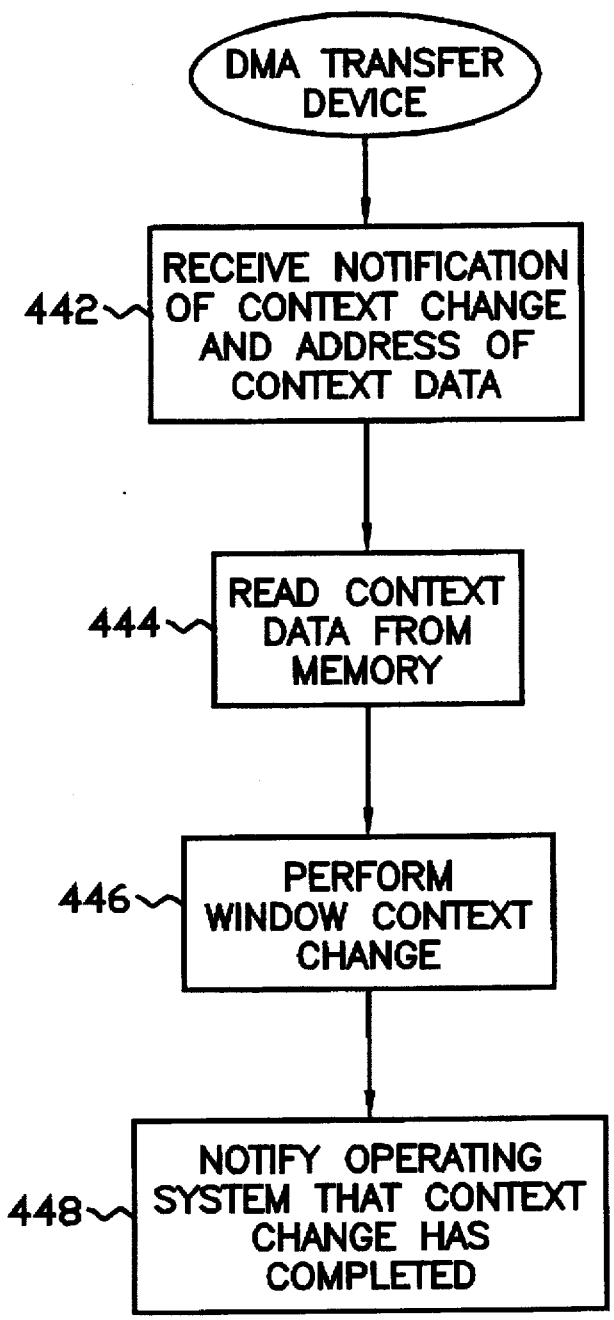
FIG. 7 is a flowchart diagram illustrating operation of the DMA transfer device performing a window context change according to the present invention.

Referring now to FIG. 7, once the context switch handler has notified the DMA transfer device of the context change in step 406 and has provided the address of the context data to the DMA transfer device in step 408, then the DMA transfer device performs context switching operations in parallel with context changes performed by the operating system in step 410. In step 442 the DMA transfer device receives the notification of the context change and the address of the context data from the context switch handler. In step 444 the DMA transfer device reads the context data from memory 204. In step 446 the DMA transfer device performs the various window context changes. This involves using the context data from the memory to reprogram various registers in the DMA transfer device according to the new window context.

The window context primarily involves parameters associated with mapping cycles from the CPU bus to the VXI bus. For example, the new window context preferably includes the address space on the MXI or VXI bus that the process maps to, the address space of the transfer, the status of the last transfer, and whether to use features such as write posting and prefetching. The window context may include other information, as desired.

When these window context changes are completed, in step 448 the DMA transfer device notifies the operating system that the context change has completed. It is noted that steps 442–446 are performed during the time that the operating system is performing the various operating system context changes in step 410. Therefore, the DMA transfer device performs its window context changes in parallel with the operating system. This allows window context switching operations to be performed more quickly.

Referring again to FIG. 6, when the operating system has completed its context changes in step 410, then the operating system waits until the DMA transfer device notifies it that the DMA transfer device has completed its context changes. When the operating system receives the notification that the DMA context changes have completed in step 412, then in step 414 the operating system switches in the new process for execution on the CPU 202, and operation completes.

An example of a process context change is as follows. Assume that a first process referred to as process A communicates with an instrument at address 1000 in the A16 address space and a second process referred to as process B communicates with an instrument at address 2000 in the A24 address space. Thus, these two instruments reside in two different address spaces as well as at different addresses. In addition, these processes maintain one or more status bits indicative of the status of the last transfer performed as part of their respective contexts. These status bits are used to indicate whether the last transfer completed successfully or whether the last transfer had an error and the type of error. Process A and process B may also have different features enabled, such as write posting and read prefetching, etc. If the computer system is executing process A and then it is necessary to switch from process A to process B, the context of process A is preferably stored. The context switch handler then informs the DMA transfer device of the new process and the address of the context data for the new process. In response, the DMA transfer device reads the context data and configures itself accordingly. This involves the DMA transfer device loading new values in various registers to change the address space from the A16 space to the A24 space as well as changing the address from 1000 to 2000. The DMA transfer device also loads a new value in a status register to change the status bits according to process B. In addition, the DMA transfer device enables various features such as write posting, read prefetching, etc. according to the context for process B. During this time the operating system performs various operating system context changes to switch from process A to process B. When the DMA transfer device completes its context changes, it notifies the operating system, which then switches in the new process.

Therefore, the present invention allows a hardware device to perform window context switching operations in parallel with other context switching operations. Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A method for performing context switches in an instrumentation system comprising a CPU, a memory coupled to the CPU, a plurality of instruments, and a direct memory access transfer device coupled to the memory and the plurality of instruments, wherein a plurality of processes execute on the CPU to perform operations on the plurality of instruments, the method comprising the steps of:

storing a first context in the memory at a first address;

providing said first address of said first context to the direct memory access transfer device, wherein said first context corresponds to a first process and wherein said first process requires the direct memory access transfer device to have said first context when said first process is executing on the CPU;

the direct memory access transfer device receiving said first address;

the direct memory access transfer device reading said first context from the memory using said first address;

the direct memory access transfer device configuring itself according to said first context after said step of reading said first context from the memory; and said first process beginning execution on the CPU after said step of the direct memory access transfer device configuring itself according to said first context.

2. The method of claim 1, wherein said instrumentation system includes a computer system, and wherein said computer system includes said CPU and said memory, the method further comprising:

the computer system performing context switching operations during at least a portion of said step of the direct memory access transfer device configuring itself.

3. The method of claim 2, wherein an operating system executes in the CPU to control operations of said computer system, the method further comprising:

the operating system performing context switching operations in said instrumentation system during said step of the direct memory access transfer device configuring itself.

4. The method of claim 3, further comprising:

invoking the operating system to switch in execution of said first process on the CPU prior to said step of providing said first address.

5. The method of claim 3, wherein a second process is executing on the CPU prior to said step of the operating system performing context switching operations, wherein said second process has a second context, the method further comprising:

saving said second context of said second process prior to said step of said first process beginning execution.

6. The method of claim 3, further comprising:

the direct memory access transfer device notifying the operating system that the direct memory access transfer device has completed said step of configuring itself according to said first context after said step of configuring; and the operating system switching in execution of said first process on the CPU in response to receiving said notification from the direct memory access transfer device that the direct memory access device has completed said step of configuring.

7. The method of claim 3, further comprising:

storing a second context for a second process in the memory at a second address;

invoking the operating system to switch in execution of said second process on the CPU after said step of the first process beginning execution;

providing said second address of said second context to said direct memory access transfer device, wherein said second process requires the direct memory access transfer device to have said second context when said second process is executing on the CPU;

the direct memory access transfer device receiving said second address;

the direct memory access transfer device reading said second context from the memory using said second address;

the direct memory access transfer device configuring itself according to said second context after said step of reading said second context from the memory; and said second process beginning execution on the CPU after said step of the direct memory access transfer device configuring itself according to said second context.

8. The method of claim 7, further comprising the operating system performing context switching operations in said instrumentation system during said step of the direct memory access transfer device configuring itself according to said second context.

9. The method of claim 1, wherein the instrumentation system further comprises an instrumentation bus coupled to said CPU, wherein said plurality of instruments are coupled to the instrumentation bus;

wherein said first context comprises one or more parameters for mapping cycles from said CPU to the instrumentation bus.

10. The method of claim 9, wherein said first context includes a target address space of an instrument coupled to the instrumentation bus.

11. The method of claim 10, wherein said first context further includes a status of a last transfer performed by said first process.

12. The method of claim 1, wherein said steps of the direct memory access transfer device reading said first context from the memory using said first address and configuring itself according to said first context do not require CPU involvement.

13. An instrumentation system which performs more efficient context switching operations, comprising:

an instrumentation bus;

a plurality of instruments coupled to said instrumentation bus which perform desired tests and measurements, a CPU which executes a plurality of processes for communicating with said plurality of instruments, wherein said CPU generates cycles which propagate to said instrumentation bus to communicate with said instruments in response to respective processes executing on said CPU;

a memory coupled to said CPU which stores a plurality of context data corresponding to said plurality of processes;

a direct memory access transfer device coupled to said CPU, said memory, said instrumentation bus, and said plurality of instruments;

wherein when a new process is to be switched in for execution on said CPU, said CPU notifies said direct memory access transfer device of said new process;

wherein the direct memory access transfer device includes context switching logic which reads one of said plurality of contexts from said memory corresponding to said new process and configures the direct memory access transfer device according to said one of said plurality of contexts corresponding to said new process in response to said CPU notifying said direct memory access transfer device of said new process.

14. The instrumentation system of claim 13, wherein an operating system executes on said CPU when the new process is to be switched in for execution on said CPU;

wherein said operating system invokes a context switch handler on said CPU which notifies said direct memory access transfer device of said new process.

15. The instrumentation system of claim 14, wherein said context switch handler provides a first address corresponding to first context data to said direct memory access transfer device.

16. The instrumentation system of claim 15, wherein said operating system executing on said CPU performs context change operations while said context switching logic in the direct memory access transfer device configures the direct memory access transfer device according to said first context data.

17. The instrumentation system of claim 15, wherein said context switching logic in the direct memory access transfer device reads said first context data from the memory using said first address and configures the direct memory access transfer device according to said first context data without CPU involvement.

18. The method of claim 1, wherein the direct memory access transfer device includes a plurality of registers which store data indicating a context, wherein the direct memory access transfer device configuring itself according to said first context comprises the direct memory access transfer device programming its registers according to said first context.

* * * * *